United States Patent
Bengtson et al.

(10) Patent No.: US 7,343,138 B2
(45) Date of Patent: Mar. 11, 2008

(54) COMPENSATING FOR LOAD PULL IN ELECTROMAGENTIC SIGNAL PROPAGATION USING ADAPTIVE IMPEDANCE MATCHING

(75) Inventors: David Bengtson, Easton, PA (US); Dale Scott Douglas, Jersey City, NJ (US)

(73) Assignee: M/A-COM, Inc., Lowell, MA (US)

( * ) Notice: Subject to any disclaimer, the term of this patent is extended or adjusted under 35 U.S.C. 154(b) by 455 days.

(21) Appl. No.: 10/730,725

(22) Filed: Dec. 8, 2003

(65) Prior Publication Data

US 2005/0124303 A1    Jun. 9, 2005

(51) Int. Cl.
*H04B 1/04* (2006.01)
(52) U.S. Cl. .................... 455/103; 455/127.3
(58) Field of Classification Search ........... 455/103, 455/110, 114.1, 114.2, 127.1, 127.2, 127.3; 333/32; 330/278, 295
See application file for complete search history.

(56) References Cited

U.S. PATENT DOCUMENTS

| | | | |
|---|---|---|---|
| 3,978,422 A | 8/1976 | Rheinfelder | |
| 4,534,040 A | 8/1985 | Thapar | 375/39 |
| 4,580,111 A | 4/1986 | Swanson | |
| 4,586,000 A | 4/1986 | Wagner | |
| 4,646,359 A | 2/1987 | Furrer | |
| 4,804,931 A | 2/1989 | Hulick | 332/31 R |
| 4,947,455 A | 8/1990 | Swanson | 455/115 |
| 4,952,890 A | 8/1990 | Swanson | 332/152 |
| 5,017,888 A | 5/1991 | Meinzer | 330/295 |
| 5,268,658 A | 12/1993 | Edwards | 332/151 |
| 5,278,997 A | 1/1994 | Martin | |
| 5,311,143 A | 5/1994 | Soliday | |
| 5,367,272 A | 11/1994 | Hulick | 332/149 |
| 5,392,007 A | 2/1995 | Cripe | 332/149 |
| 5,410,280 A | 4/1995 | Linguet et al. | |
| 5,450,044 A | 9/1995 | Hulick | 332/103 |

(Continued)

FOREIGN PATENT DOCUMENTS

DE    28 07 813 B1    6/1979
WO    WO 01/10013 A1    2/2001

OTHER PUBLICATIONS

Hulick, "The Digital Linear Amplifier", Schwenksville, Pennsylvania.

(Continued)

*Primary Examiner*—Nguyen T. Vo

(57) ABSTRACT

The invention relates to for processing an electromagnetic input signal, wherein the signal is passed through an input to be modified across a plurality of modifying segments using a characteristic of the signal, and wherein the plurality of segments have a plurality of states controlled by a control signal, by determining a reference impedance for the input signal, by determining a reference impedance for the input for one or more states of the plurality of segments; and adaptively adjusting impedance of the input toward the reference impedance. This may be accomplished for example, by using a matching circuit comprising one or more selected from the group consisting of a digital signal processor, a microprocessor, a logic circuit, an integrated circuit, a phase shifter, a resistor, a variable inductor, and a variable capacitor. The matching circuit determines shifts in impedance of the input after a change in state of the segments; and adaptively adjusts the impedance based upon the shift.

17 Claims, 6 Drawing Sheets

U.S. PATENT DOCUMENTS

| | | | |
|---|---|---|---|
| 5,469,127 A | 11/1995 | Hulick et al. .............. 332/149 |
| 5,621,351 A | 4/1997 | Puri et al. .................... 330/10 |
| 5,642,002 A | 6/1997 | Mekanik et al. |
| 5,669,068 A | 9/1997 | Kielmeyer et al. |
| 5,673,001 A | 9/1997 | Kim et al. |
| 5,673,287 A | 9/1997 | Colvis et al. |
| 5,774,017 A | 6/1998 | Adar |
| 5,818,298 A | 10/1998 | Dent et al. |
| 5,867,060 A | 2/1999 | Burkett, Jr. et al. ............ 330/2 |
| 5,867,071 A | 2/1999 | Chethik ..................... 332/103 |
| 5,880,633 A | 3/1999 | Leizerovich et al. |
| 5,886,573 A | 3/1999 | Kolanek ..................... 350/10 |
| 5,892,431 A | 4/1999 | Osterman |
| 5,901,345 A * | 5/1999 | Ikeda et al. .............. 455/114.3 |
| 5,930,128 A | 7/1999 | Dent |
| 5,939,951 A | 8/1999 | Bateman et al. |
| 5,942,946 A | 8/1999 | Su et al. |
| 5,952,870 A | 9/1999 | Urban |
| 5,952,895 A | 9/1999 | McCune, Jr. et al. |
| 5,999,046 A | 12/1999 | Kotzamanis ........... 330/124 R |
| 6,020,787 A | 2/2000 | Kim et al. |
| 6,041,082 A | 3/2000 | Takeda et al. .............. 375/300 |
| 6,043,707 A | 3/2000 | Budnik |
| 6,043,712 A | 3/2000 | Leizerovich et al. |
| 6,075,413 A | 6/2000 | Katakura |
| 6,078,628 A | 6/2000 | Griffith et al. |
| 6,094,101 A | 7/2000 | Sander et al. |
| 6,097,252 A | 8/2000 | Sigmon et al. |
| 6,101,224 A | 8/2000 | Lindoff et al. |
| 6,112,071 A | 8/2000 | McCune, Jr. |
| 6,130,910 A | 10/2000 | Anderson et al. ........... 375/238 |
| 6,133,788 A | 10/2000 | Dent |
| 6,140,875 A | 10/2000 | Van Den Homberg et al. |
| 6,140,882 A | 10/2000 | Sander |
| 6,147,553 A | 11/2000 | Kolanek |
| 6,157,681 A | 12/2000 | Daniel et al. |
| 6,191,653 B1 | 2/2001 | Camp, Jr. et al. |
| 6,198,347 B1 | 3/2001 | Sander et al. |
| 6,201,452 B1 | 3/2001 | Dent et al. |
| 6,215,355 B1 | 4/2001 | Meck et al. |
| 6,215,359 B1 | 4/2001 | Peckham et al. |
| 6,219,394 B1 | 4/2001 | Sander |
| 6,236,284 B1 | 5/2001 | Duello et al. |
| 6,242,975 B1 | 6/2001 | Eidson et al. |
| 6,246,286 B1 | 6/2001 | Persson |
| 6,255,906 B1 | 7/2001 | Eidson et al. |
| 6,259,901 B1 | 7/2001 | Shinomiya et al. |
| 6,269,135 B1 | 7/2001 | Sander |
| 6,285,251 B1 | 9/2001 | Dent et al. |
| 6,288,916 B1 | 9/2001 | Liu et al. |
| 6,294,957 B1 | 9/2001 | Luu |
| 6,297,694 B1 | 10/2001 | Yamamoto |
| 6,298,244 B1 | 10/2001 | Boesch et al. |
| 6,311,046 B1 | 10/2001 | Dent |
| 6,317,608 B1 | 11/2001 | Glöcker |
| 6,321,072 B1 | 11/2001 | Cipriani et al. |
| 6,323,731 B1 | 11/2001 | McCune, Jr. |
| 6,349,216 B1 * | 2/2002 | Alberth et al. ........... 455/550.1 |
| 6,356,155 B1 | 3/2002 | Judkins |
| 6,366,177 B1 | 4/2002 | McCune et al. |
| 6,369,657 B2 | 4/2002 | Dening et al. |
| 6,377,784 B2 | 4/2002 | McCune |
| 6,380,802 B1 | 4/2002 | Pehike et al. |
| 6,404,823 B1 | 6/2002 | Grange et al. |
| 6,411,655 B1 | 6/2002 | Holden et al. |
| 6,426,677 B1 | 7/2002 | Prentice |
| 6,426,678 B1 | 7/2002 | Ko |
| 6,430,402 B1 | 8/2002 | Agahi-Kesheh |
| 6,445,247 B1 | 9/2002 | Walker |
| 6,449,465 B1 | 9/2002 | Gailus et al. |
| 6,522,201 B1 | 2/2003 | Hsiao et al. |
| 6,556,814 B1 | 4/2003 | Klomsdorf et al. |
| 6,636,112 B1 | 10/2003 | McCune ...................... 330/10 |
| 6,658,238 B1 | 12/2003 | Ursenbach et al. ......... 455/102 |
| 6,680,652 B2 | 1/2004 | Hoheisel et al. |
| 6,738,432 B2 | 5/2004 | Pehlke et al. ............... 375/300 |
| 6,765,536 B2 | 7/2004 | Phillips et al. |
| 6,791,417 B2 | 9/2004 | Pengelly et al. ............ 330/295 |
| 6,799,020 B1 | 9/2004 | Heidmann et al. .......... 455/103 |
| 6,816,008 B2 | 11/2004 | Kontson ..................... 330/51 |
| 6,990,164 B2 | 1/2006 | Bushman et al. |
| 6,995,842 B2 | 2/2006 | Opsal |
| 7,030,691 B2 * | 4/2006 | Kim ........................... 330/51 |
| 7,079,815 B2 * | 7/2006 | Pozgay et al. ............... 455/78 |
| 2003/0001668 A1 * | 1/2003 | Mruz et al. ................... 330/51 |
| 2005/0030104 A1 | 2/2005 | Chen et al. ................. 330/295 |

OTHER PUBLICATIONS

Kozyrey, "Single-Ended Switching-Mode Tuned Power Amplifier with Filtering Circuit", Poluprovodnikovye pribory v tekhnike svyazi, 1971, pp. 152-166, vol. 6.

TimeStar™, "Multi-Mode Polar Modulator" 2002, Tropian Headquarters, USA.

Sundstrom, "Digital RF Power Amplifier Linearisers", 1995, Sweden.

Kenington, "Linearised RF Amplifier and Transmitter Techniques", Microwave Engineering Europe, Nov. 1998.

Mann, et al., "Increasing Talk-Time with Efficient Linear PAs", Presented at IEE Colloquim on Tetra Market and Technology Developments, Feb. 2000, London.

Mann, et al., "Increasing the Talk-Time of Mobile Radios with Efficient Linear Transmitter Architectures", Electronics & Communication Engineering Journal, Apr. 2001, pp. 65-76, vol. 13, No. 2.

Heimbach, "Digital Multimode Technology Redefines the Nature of RF Transmission", Applied Microwave & Wireless, Aug. 2001.

Swanson, "Digital AM Transmitters", IEEE Transactions on Broadcasting, Jun. 1989, pp. 131-133, vol. 35, No. 2.

Tropian-Products Main, www.tropian.com/products/, Copyright 2000-2001, Aug. 14, 2002.

"Tropian and Agilent Technologies announce collaboration on multi-band, multi-mode 2.5G transmitter solutions", Feb. 18, 2002, Cannes, France.

"Tropian Awarded 8th U.S. Patent for Wireless Technology: Innovative RF Power Processing Circuit Architecture Achieves Speed and Accuracy in Polar Modulation," Aug. 6, 2001, Cupertino, California.

Dialog Web Command Mode, p. 1 of 1, Sep. 17, 2002, Record 03929207, Polar Modulators for 1 and 2 GHz Power Amplifier Correction, Nisbet, J.

Dialog Web Command Mode, p. 1 of 1, Sep. 17, 2002, Record 0326082, A new Class-AB Design, De Jager, et al., Electronics World 105, Dec. 1999, p. 982-7.

Dialog Web Command Mode, p. 1 of 1, Sep. 17, 2002, Record 2371235, Increasing the talk-time of mobile radios with efficient linear transmitter architectures, Mann et al., Electronics & Communication Engineering Journal, v. 13, No. 2, Apr. 2001 (p. 65-76).

Dialog Web Command Mode, p. 1 of 3, Sep. 17, 2002, Record 15595216, The big climate amplifier ocean circulation-sea-ice-storminess-dustiness-albedo, Broecker, Geophysical Monograph, 2001, 126, 53-56, etc.

Dialog Web Command Mode, p. 1 of 9, Sep. 19, 2002, Record 10872787, Out-of-band emissions of digital transmissions using Kahn EER technique, Rudolph, IEEE Transactions on Microwave Theory & Techniques, 2002, V 50, N 8, August, p. 1979-1983, etc.

Dialog Web Command Mode, p. 1 of 20, Sep. 17, 2002. Record 01239474, GSM players Eye Edge Despite Transmit Woes, Keenan, Electronic Engineering Times, 2002, n 1211, p. 6.

\* cited by examiner

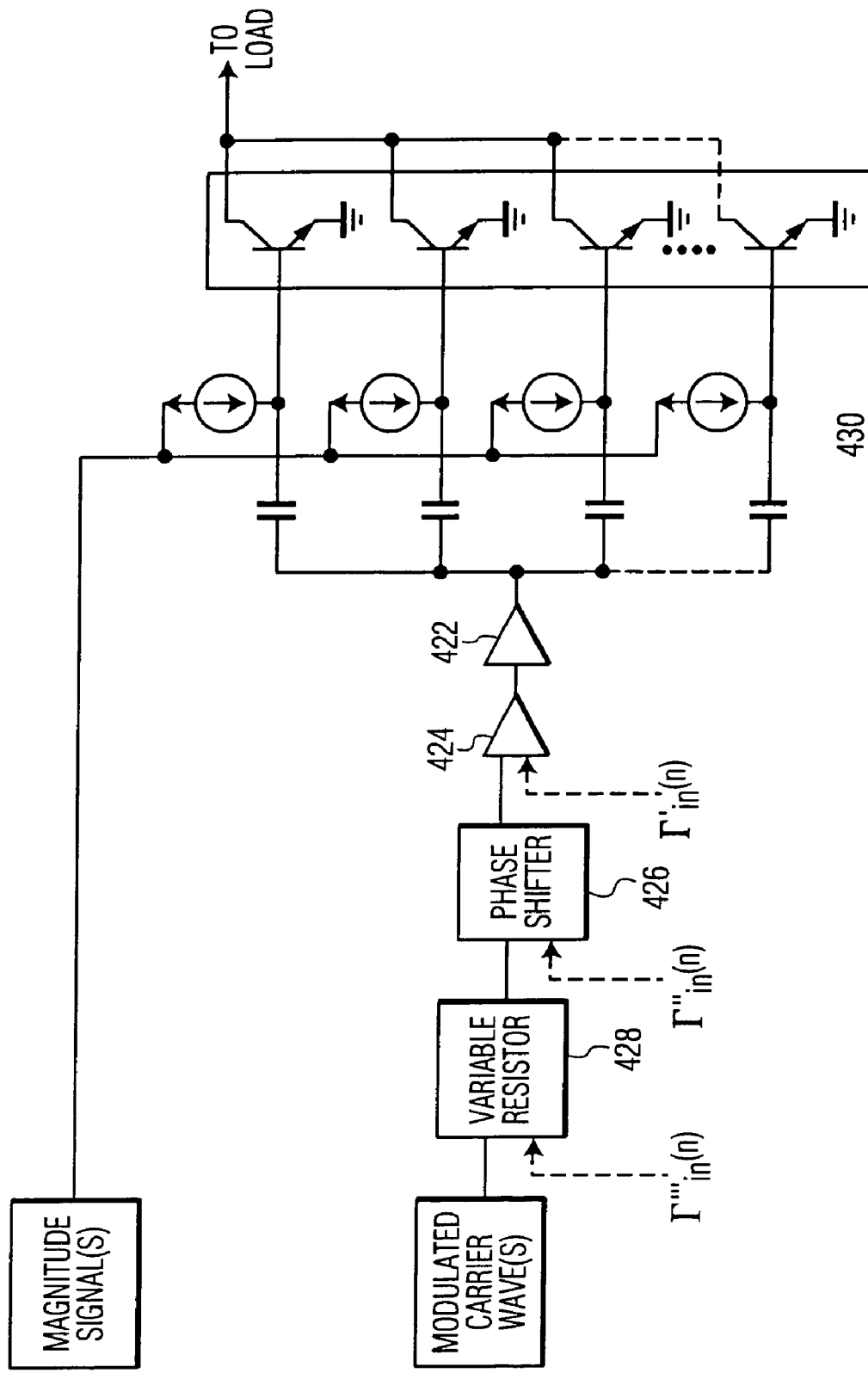
FIG. (4b)

COMPENSATING FOR LOAD PULL IN ELECTROMAGNETIC SIGNAL PROPAGATION USING ADAPTIVE IMPEDANCE MATCHING

FIELD OF THE INVENTION

The invention relates to compensating for load pull in the propagation of electromagnetic waves and signals. More particularly, the invention relates to a system for compensating for errors in electromagnetic signal propagation by adaptive impedance matching.

BACKGROUND OF THE INVENTION

Electromagnetic waves may be transferred from place to place through a conductor. In wired transmission, the conductor is usually a wire or other solid substance. In wireless transmission, the conductor is usually an ambient substance, such as air, water, etc. In wireless connections a transmitter is usually used to transfer a wave and a receiver to receive a wave. A transceiver combines the functions of both transmitter and receiver in one system. A transmitter typically converts electrical energy into a signal, which is then broadcast via an antenna to a receiver's antenna. Repeaters, middle stations, etc. may be used as intermediates in the transmission to sustain the integrity of the transmitted wave.

The electrical energy input into a transmitter usually is modulated into a basic transmission or carrier signal by overlaying some intelligence upon the energy—speech, data, etc.—in the form of an information signal, and the receiver typically demodulates the modulated carrier signal, once received, into a copy of the initial intelligence sent by the transmitter.

In order to accomplish their function, transmitters and receivers are comprised of various building block components. An electromagnetic information signal (which may be generated from the intelligence in any number of ways, e.g., by one or more transducers, such as a microphone, or received from a modulator, such as an analog modem) to be propagated may be modulated onto a carrier signal using a mixer. The carrier wave itself is usually generated by an oscillator. An amplifier is usually used at one or more places in the transmitter circuitry to boost the signal strength, to provide power to active components, etc. Similarly, one or more filters are usually used as well, to clean up the input wave, the outputted signal, etc. An antenna is used to broadcast the signal, and a power supply will supply power as needed.

Various techniques may be used to actually transfer the intelligence. For example, electromagnetic waves representing the information signal in wireless transmission may be modulated into carrier signals by varying wave characteristics such as amplitude, frequency and phase, in an analog manner.

In certain embodiments of such systems, a segmented amplifier may be used to amplify the modulated signal for transmission. A segmented amplifier typically comprises a plurality of segments that are used to amplify an input wave by a predetermined gain. The type of segment is not limited and may comprise, for example, power amplifiers, current sources, etc. Each segment is typically controllable to be switched on or off by receiving an analog or digital control signal. The output from each segment may then be combined to create the output signal.

One way in which a segmented amplifier may be used, for example, is in the modulation/amplification of an input signal, such as in the amplitude modulation of a phase-modulated signal (although they may be used in other types of modulation and amplification as well). Each stage of the segmented amplifier has a pre-determined gain, and is switched on and off based upon a control signal based upon the amplitude of the input signal to provide a contribution of to the output signal.

However, switching the multiple stages of the segmented amplifier in this manner may cause the input impedance of the amplification system to shift. This shift in impedance may pull the phase modulating portion of the system off its desired carrier frequency, a phenomenon known as "load pull."

Accordingly, it would be desirable to provide more efficient and precise transmitter, receiver and transceiver systems, methods and articles of manufacture, and particularly to reduce the input impedance shift created in segmented amplifiers due to the change in state of the segments to a small enough range that the carrier wave portion of a modulated signal inputted to the amplifier is not pulled off frequency during modulation.

SUMMARY OF THE INVENTION

The invention comprises systems, methods and articles of manufacture for transmitting and receiving electromagnetic waves and signals. Embodiments of the invention may include a system for the processing of an electromagnetic input signal, wherein the signal is passed through an input to be modified across a plurality of modifying segments using a characteristic of the signal to generate an output signal, and wherein the plurality of segments have a plurality of states controlled by a control signal, by determining a reference impedance for the input for one or more states of the plurality of segments; and adaptively adjusting impedance of the input toward the reference impedance.

This may be accomplished for example, by using a matching circuit comprising one or more selected from the group consisting of a digital signal processor, a microprocessor, a logic circuit, an integrated circuit, a phase shifter, a resistor, a variable inductor, and a variable capacitor. The matching circuit is capable of determining any shift in impedance of the input after a change in state of the segments; and adaptively adjusting the impedance based upon this shift.

BRIEF DESCRIPTION OF THE DRAWINGS

For the purpose of illustrating the invention, there is shown in the drawings at least one embodiment, which is presently preferred; it being understood, however, that this invention is not limited to the precise arrangements, methods and instrumentalities shown.

FIGS. 4(a)-(b) are diagrams illustrating a segmented amplification system in a phase and amplitude modulation transmitter in accordance with aspects of the invention.

DETAILED DESCRIPTION OF THE INVENTION

Figure 1A:
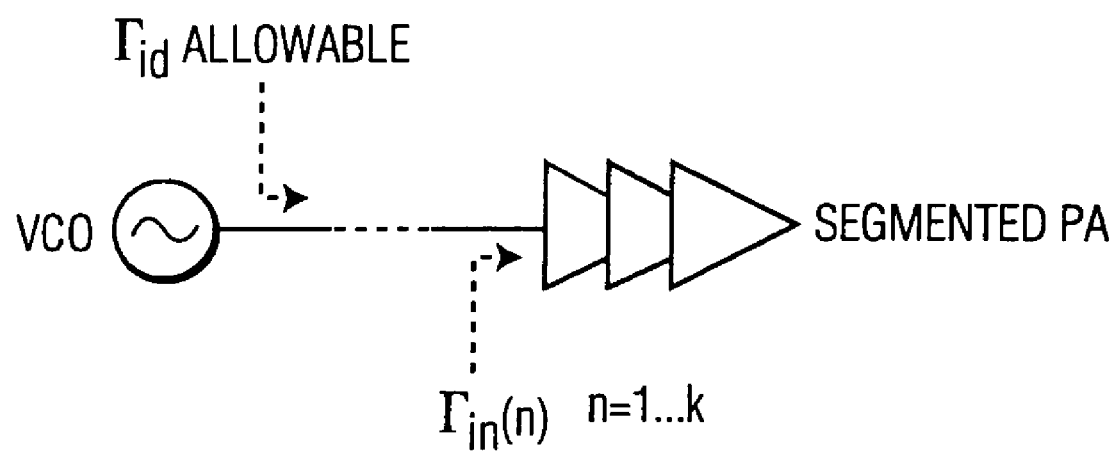
FIG. 1(a) is a diagram illustrating the relationship between a segmented amplification system and a carrier wave source.

Embodiments of the invention include apparatus, methods and articles of manufacture for transmitting and receiving electromagnetic waves and signals. Embodiments of the invention may be entirely comprised of hardware, software and/or may be a combination of software and hardware. Accordingly, individual blocks and combinations of blocks in the drawings support combinations of mechanisms for performing the specified functions and/or combinations of steps for performing the specified functions. Each of the blocks of the drawings, and combinations of blocks of the drawings, may be embodied in many different ways, as is well known to those of skill in the art.

The word "signal" is used herein to describe an electromagnetic wave that has been modulated in some fashion, usually by the impression of intelligence upon the wave, for example imposing data upon a carrier wave. It should also be noted that the use of "signal" and "wave" in the singular includes the plural (or multiple signals and waves respectively) as often transmitters, receivers and transceivers generate more than one signal and/or wave in the normal course of their operation. For example, multiple harmonics of the baseband might be desirably generated as in amplitude modulation; multiple frequencies might be generated, etc. It should also be noted that embodiments of the invention might be used as well to input and/or output waves, as well as signals, as is further described below.

A segmented power amplifier (SA) typically comprises a plurality of switchable amplifying segments. Each of these segments may have a predetermined gain, so that a signal passed through them will produce a corresponding output signal amplified by that gain. The output from a plurality of these segments may then be combined to produce a desired output signal. Thus, each possible combination of on/off for the segments produces a number of amplification states for the SA.

In some SA's, the different segments may be switched on and off based upon a control signal. This allows the SA to modulate the amplitude of the output signal in addition to providing overall amplification. For example, there may be an N number of segments for a data control signal. Each of the segments may receive a signal from a control component if the control component is on, and so each segment is regulated according to that component. In some embodiments of such systems, the regulation may be of the bias current to the segments and the control component may be referred to as a bias control circuit, and a number of them as a bias network. In some embodiments, it may be desired to statically or dynamically allocate one or more control circuits to one or more segments. If the control signal is a digital control word, and each segment is assigned to one bit of that control word, then the number of possible amplification states for the system would be $2^N$. In this example, if there are seven segments and a seven-bit control word, then the number of states would be $2^7=128$.

Figure 1B:
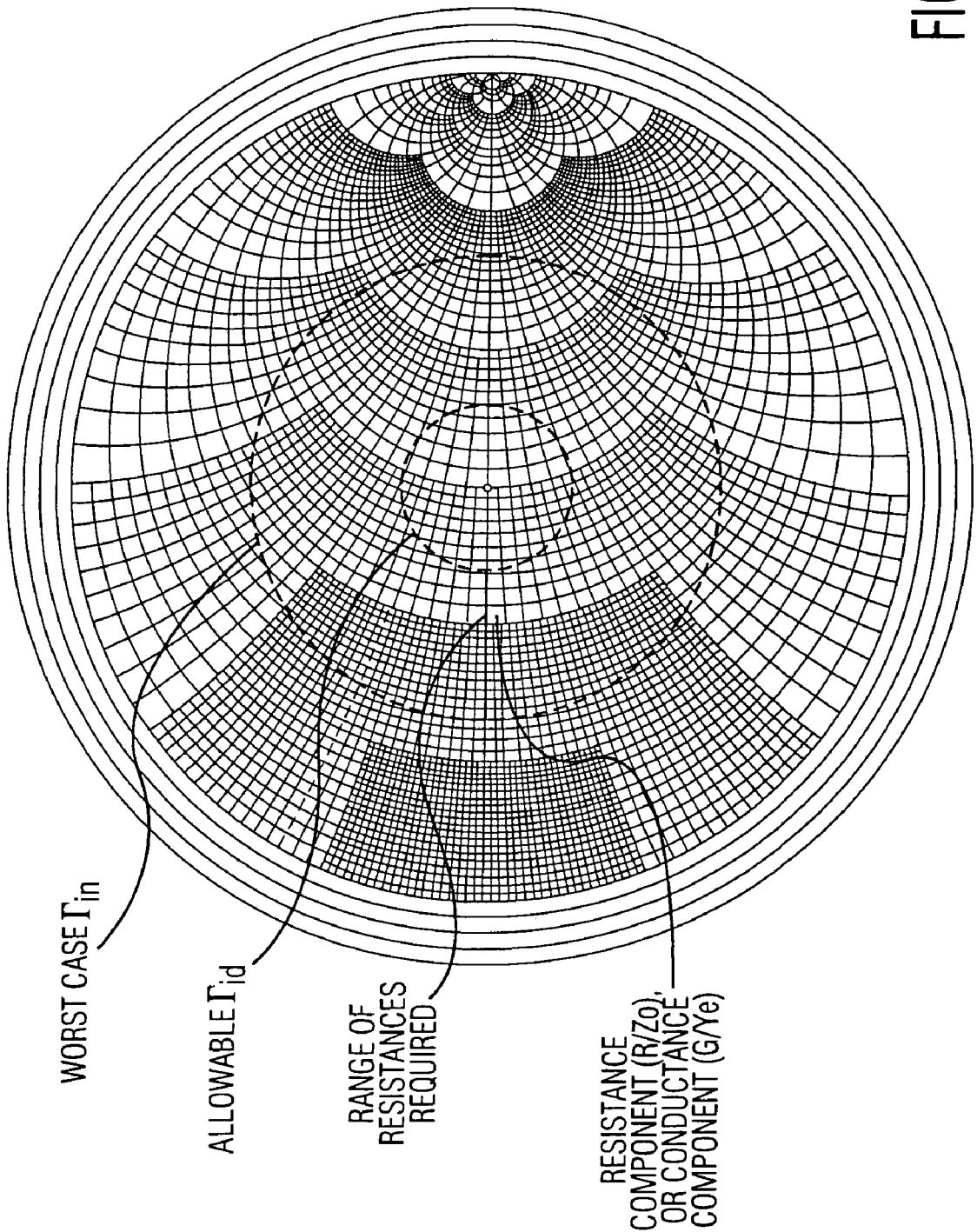
FIG. 1(b) is a chart illustrating the allowable variation in input impedance seen by a carrier wave source.

The switching of these multiple stages may cause the input impedance of the SA to shift. This shift may, in turn, cause a shift in the frequency of the signal being inputted to the SA. This is illustrated in FIGS. 1(a)-(b). As shown in FIG. 1(a), a wave source oscillating at a certain frequency, such as a voltage controlled oscillator (VCO), provides an input to an SA. Each state of the SA may result in a different impedance seen by the wave source due to different segments being active in different states. This difference in impedance may result in differing amounts of the input signal being absorbed by the SA and being reflected back, due to an impedance mismatch between the waves source and the SA. This causes a change in the input reflection coefficient, which is a measure of the amount of the signal reflected back and not absorbed to the input signal transmitted.

Thus, the input reflection coefficient of the SA, $\Gamma_{in}$, is a function of the instantaneous state, n. The VCO can typically withstand a certain amount of variation in the load reflection coefficient, $\Gamma_{id}$. This is illustrated pictorially in FIG. 1(b). In FIG. 1(b), the outer circle has a radius of Max $|\Gamma_{in}(n)|$, where n=1 to k, where k is the maximum number of states in the SA. The input impedance in any state will lie within this circle. The inner circle has a radius of $|\Gamma_{id}|$. The specifications of the VCO allow it to work into any impedance contained within this circle.

Figure 2:
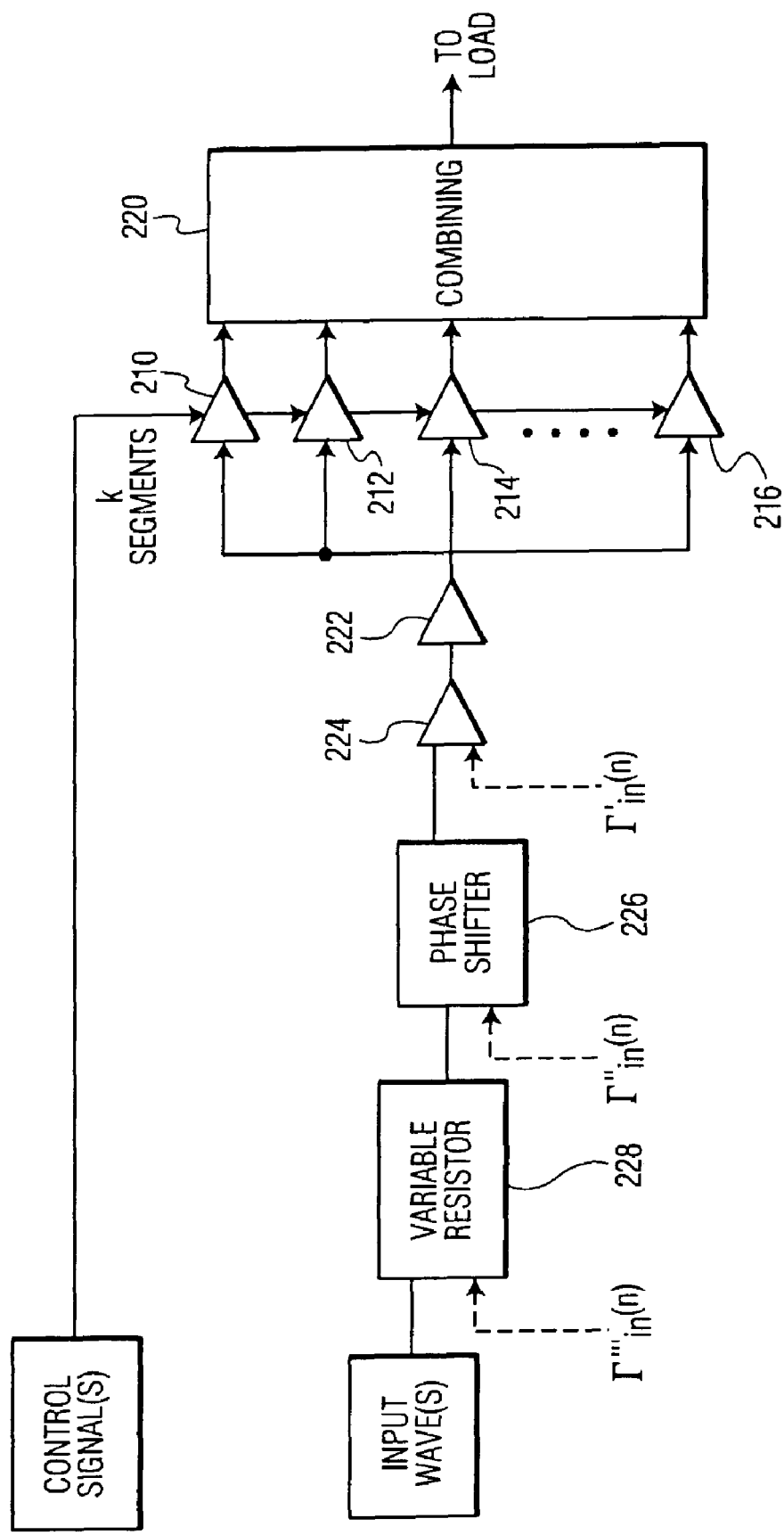
FIG. 2 is a diagram illustrating a segmented amplification system in accordance with aspects of the invention.

One embodiment of an SA is illustrated in FIG. 2. As shown in FIG. 2, an input wave (such as the aforementioned modulated carrier wave, although not limited thereto) may be inputted into each of a plurality of individual amplifying segments (210-216). A control signal may be inputted to control amplifying segments (210-212). Each of the amplifying segments may or may not produce an output depending on the magnitude control signal received by it.

These segments may comprise, for example, power amplifiers, although not limited thereto. In this example, the output of each segment may then be combined in combining circuit 220, creating an output signal to drive the load. Combining circuit 220 is not particularly limited, and may comprise any mechanism for combining the output from each power amplifier, such as by using power transformers, quarter-wave transmission lines, discrete LC components (e.g., Pi-networks), and the like.

Typically, the amplifier segments are preceded by some number of driver stages (222, 224) for buffering, gain, and impedance matching, for example. The input impedance of the first driver 224 may be nominally matched to a characteristic reference impedance, $Z_o$, for one of the states achievable by the SA. In one embodiment, the impedance matching is accomplished using highest state of the amplifier, but the invention is not limited thereto and may be matched using any amplifier state. Matching the impedance using the highest state provides advantages in efficiency and power output.

As previously noted, the switching on and off of the multiple parallel gain stages of the SA may cause load pull on the frequency of the input wave. One manner in which this may be corrected is by adaptively matching the input impedance of the amplifier to that of the modulator source. For example, a phase shifter 226 and a variable resistor 228 may be used to compensate for the changes in impedance seen by the input wave source. In this example, the input reflection coefficient of driver 224, $\Gamma_{in}(n)$, may be determined. From this information, phase shifter 236 may be adjusted so that $\angle\Gamma''_{in}(n)=\pi$. Referring back to FIG. 1(b), this would place $\Gamma_{in}(n)$ on the real axis, somewhere between the bounding circles. Also, variable resistor 238 may be adjusted so that $\Gamma'''_{in}(n)=0$. These adjustments may be timed with a control signal so that the proper adjustment may be made each time there is a change in state of the k segments of the SA. Those of ordinary skill in the art will appreciate that the reflection coefficient may not be exactly zero if errors occur during the adaptive matching process, and that a certain amount of reflected signal may occur within the scope of the invention.

However, those of ordinary skill in the art will appreciate that the manner in which the adaptive matching process may be accomplished is not particularly limited. For example, a signal processor may be programmed to receive a timing signal based upon the control signal and then adjust a phase shifter 236 and a variable resistor 238 using the determined impedance of driver 224. This impedance itself may be preprogrammed by testing or otherwise. The n-buffer for the control signal may be read periodically in conjunction with the timing signal to know the current and/or next state of the amplifier and this may be used in adaptively adjusting the phase shifter and variable resistor (or whatever the matching circuit may be) to account for differences in the input impedance. Phase shifter 236 and variable resistor 238 are not particularly limited and may comprise any conventional component, such as integrated circuitry. For example, phase shifter 236 may comprise a digital stepped phase shifter, delay lines, waveguide elements, microstrips, etc. Resistor 238 is also not limited and may comprise, for example, a passive, analog resistor or a digital resistor controlled by an integrated circuit. Of course, in other embodiments, other components may be used for the matching circuit, such as variable inductors, variable capacitors, etc.

Figure 3:
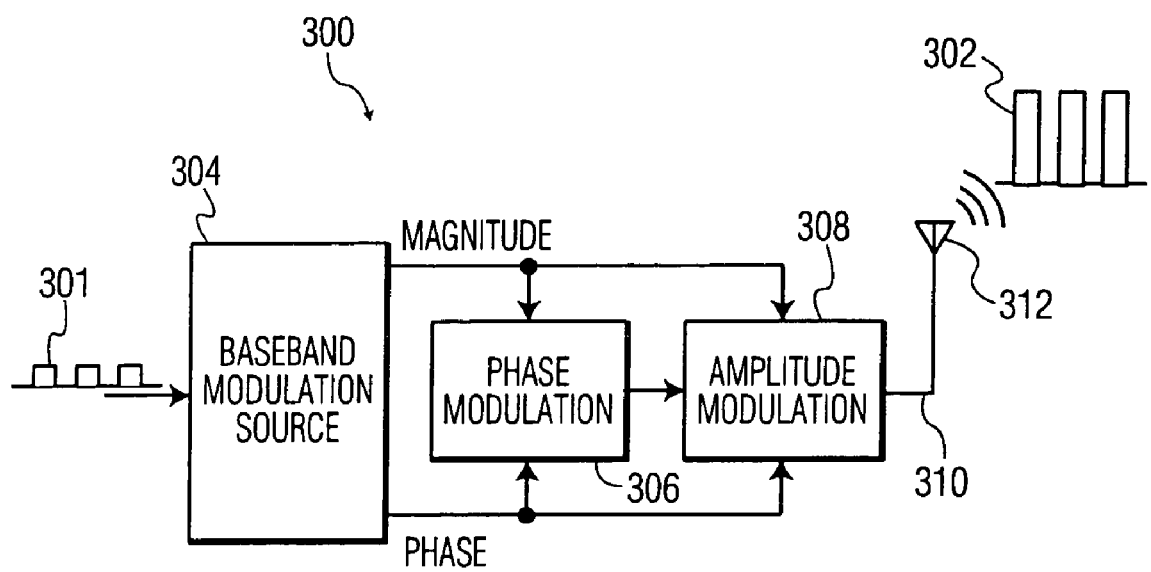
FIG. 3 is a diagram illustrating a transmitter incorporating phase and amplitude modulation.

One possible use of an SA incorporating the adaptive impedance matching system of the invention is in the transmission and reception of electromagnetic communication signals, although the invention is not limited thereto. FIG. 3 shows one embodiment of a general transmitter 300 for receiving an input wave 301 and transmitting an output signal 302. While described herein in terms of a transmitter, those of ordinary skill in the art will appreciate that the invention may also be used for receivers and transceivers as well.

Turning to FIG. 3, an input wave 301 may consist of varying types of intelligence, e.g., voice, data, etc. The input wave 301 may be analog or digital, and is not limited. Similarly the transmitted output signal 302 may consist of various types of intelligence modulated onto a carrier wave, e.g. voice, data, etc. While the output signal may be analog, a digital output signal may be constructed as well and the invention is not limited.

Transmitter 300 may comprise a baseband modulation source 304, phase modulation component 306, amplitude modulation component 308, load line 310, and an antenna 312. Baseband input wave 301 may be inputted into baseband modulation source 304, which may generate magnitude (R) and phase (θ) data signals (analog or digital) representative of input wave 301. These data signals may be used by phase modulation component 306 and amplitude modulation component 308 to generate output signal 302 at load line 310 in the manner described in more detail below. Output signal 302 is then transmitted via antenna 312.

For example, the phase information (θ) for input wave 301 may be inputted to phase modulator 306, where it may be modulated by a carrier wave signal to produce a phase modulated carrier signal. The phase modulated carrier signal may then be inputted to amplitude modulator 308. The gain or level of amplification of the amplitude of the modulated carrier wave signal may be controlled by the amplitude signal (R). This may be accomplished, for example, by using individual bits of a digital word representing the amplitude portion of input wave 301 to control individual power amplifiers or segments within amplitude modulator 308, each of which receives the modulated carrier wave signal.

In one embodiment, these R, θ characteristics of the original input wave may be modulated into digital pulses comprising a digital word quantitized into bits B1 to Bn, with a Most Significant Bit ("MSB") to Least Significant Bit ("LSB"). The digital word may be of varying lengths in various embodiments. In general, the longer the word the greater the accuracy of reproduction of the input wave by the system (i.e, its resolution). The digital words may or may not be converted to analog signals and are used to provide control for amplification of the modulated signal, in manner to be described further below. Of course, in other embodiments, a differently composed digital word may be used, or none at all; that is, characteristics of the input wave may remain in some analog form.

Figure 4A:
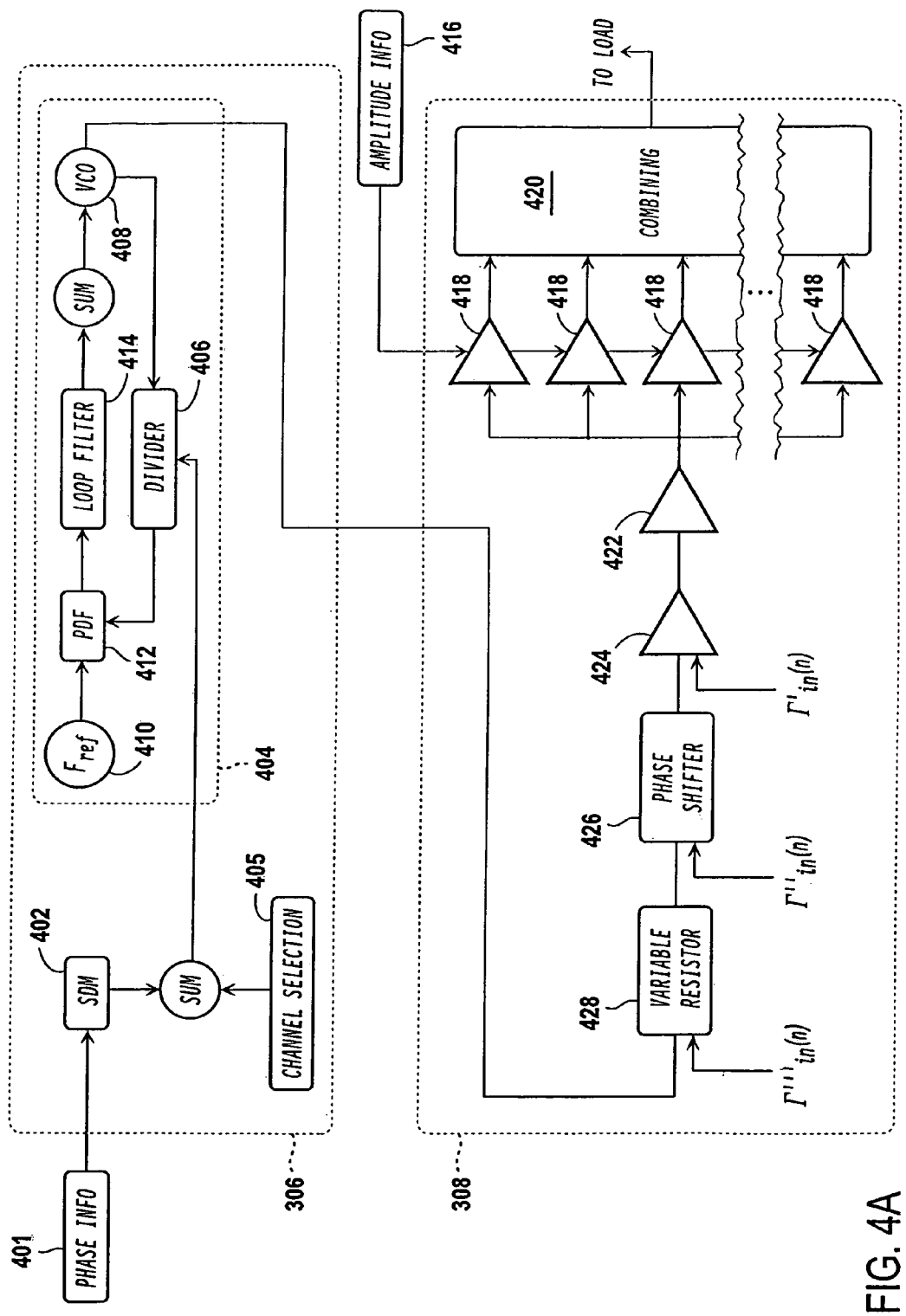

A further illustration of an embodiment of such a transmitter that may incorporate an SA is further illustrated in FIG. 4(a). As shown in FIG. 4(a), phase modulator 306 may comprise a sigma-delta modulation (SDM) based system, although the invention is not limited thereto.

The phase data signal 401 (phase information for input wave 101) may be inputted into SDM 402. SDM 402 may be used in connection with phase-locked loop (PLL) 404 to achieve wideband modulation of the input signal onto a carrier wave.

The output of SDM 402 may then be combined with the integer portion of the channel number received from channel calculator 405. The combination of the fractional and integer portions of the channel number may be inputted to divider 406 in this embodiment and used to lock PLL 404 to the desired carrier wave signal. In one embodiment, the carrier wave signal is a radio frequency (RF) signal, although the invention is not limited thereto.

The PLL 404 in the illustrated embodiment may be used to modulate a wave signal synthesized by an RF carrier wave signal source, such as carrier wave source 408, using the phase portion of the input signal. Carrier wave source 408 may be any source of electromagnetic waves that is capable for producing a carrier wave, such as a radio frequency voltage-controlled oscillator (VCO).

The frequency of a reference source 410 (or a division thereof by some number) may be compared with the output frequency of carrier wave source 408, divided by the series of numbers received by divider 406 from SDM 402 and channel calculator 405. Reference source 410 is not limited and may comprise a VCO of a constant or substantially constant frequency or may be derived from a source at another frequency.

Phase-frequency detector (PFD) 412 may be used to compare the relative phases of the two signals and then output a signal that is proportional to the difference (phase shift) between them. This output signal may be utilized to adjust the frequency of carrier wave source 408, so that the phase difference measured at PFD 412 is substantially close and preferably equal to zero. Hence, the phase of the signal is locked by the feedback loop to prevent unwanted drift of the signal phase, due to variations in the phase and frequency of carrier wave source 408.

A feedback signal from carrier wave source 408 may be passed through divider 406, with the division ratio of the divider controlled by the series of numbers representing the phase component information received from SDM 402 and the channel information received from channel calculator 405. The resulting signal may be passed to PFD 412, where it is compared with the signal from reference source 410, as noted above. This combined signal may be passed through low-pass loop filter 414, and combined with the carrier wave signal of carrier wave source 408.

The phase-modulated signal outputted from carrier wave source 408 may then be inputted into each of a plurality of individual amplifying segments (418) in amplitude modulator 308. The magnitude control signal 416 may also be inputted to control amplifying segments (418). These segments may comprise, for example, power amplifiers, although not limited thereto. Each of the power amplifying segments may or may not produce an output depending on the magnitude control signal received by it.

The output of each power-amplifying segment may then be combined in combining circuit 420, creating an output signal to drive the load. Combining circuit 420 is not particularly limited, and may comprise any mechanism for combining the output from each power amplifier, such as by using power transformers, quarter-wave transmission lines, discrete LC components (e.g., Pi-networks), and the like.

Alternatively, as shown in FIG. 4(*b*), the amplifier may also contain segmented transistor 430, which may serve as potential current sources. Each amplifying segment of the transistors may or may not act as a current source, because it is regulated via the appropriate control signal from the R data signal for regulating that control component, and activation of a segment is dependant upon the value of control signal, and concomitant regulation of the appropriate control component. The transistors and their segments may be an HBT transistor. Other transistors may be used as well, such as FET, etc., as well as other current or wave characteristic sources.

In one embodiment, each of the segments may vary in size. For example, if the overall gain of the amplifier is to be "A", one segment may be twice the size of the next segment, which in turn may be twice the size of the next segment, and so on until reaching the final segment, where the sum of the gain of all of the segments is equal to A. The largest segment may be controlled by the control signal for the R data signal that correlates to MSB of the original digital signal word, the signal representing the next bit to the next largest segment, etc., until the signal representing the LSB, which is sent to the smallest segment. Of course, as had been noted above, other embodiments may have a different pattern of matching signal to segment, and analog or digital signals may be used as the control signal. In other embodiments, other wave characteristics may be fed to another source of wave characteristics and so regulate that source.

Driver stages 422 and 424 may be used to control the current inputted into the SA. Phase shifter 426 and variable resistor 428 may be used to control the input impedance seen at the output of phase modulator 106 in the manner described above. This will allow the system of the invention to adaptively control the input impedance to the SA, thus correcting for any offset in the frequency of the modulated carrier wave due to the changes in state of the segments of the SA.

Of course, those of ordinary skill in the art will appreciate that while the invention has been described herein using a plurality of segments, a single segment maybe used as well. For example, the amplitude component the information signal may be used to control a single segment (or series of segments in an alternating fashion, where the alternating outputs of the segment are combined. Similarly, control signals may be filtered together to produce a control signal for a single amplifier segment or series of segments.

Thus, a portion of the signals that represent the input wave, such as the magnitude portion of the information signal, may be used to actuate individual amplifying segments within amplitude modulation component 108 to amplify the modulated carrier signal in relation to the original input wave. This produces an output current from amplitude modulation component 108 that represents an amplified carrier wave carrying the intelligence contained within the input wave.

In the especially preferred embodiments, a transmitter, receiver, and transceiver of the invention may be specialized for particular input waves, carrier waves and output signals, e.g. various types of cell phones, such as CDMA, CDMA2000, W-CDMA, GSM, TDMA, as well as various other types of devices, both wired and wireless, e.g. Bluetooth, 802.11a, -b, -g, GPS, radar, 1×RTT, radios, GPRS, computers and computer communication devices, handheld devices, etc. Among the modulation schemes supported by the invention are: GMSK, which is used in GSM; GFSK, which is used in DECT & Bluetooth; 8-PSK, which is used in EDGE, OQPSK & HPSK, which are used in IS-2000; p/4 DQPSK, which is used in TDMA; and OFDM, which is used in 802.11.

Various embodiments may utilize both analog and digital components insofar as these embodiments manipulate waves and signals requiring both. For example, cell phone embodiments may utilize both analog and digital components. Various types of system architectures may be utilized for constructing the embodiments. For example, an ASIC composition may be used in realizing the various architectures. CMOS and/or BiCMOS fabrication techniques may be used as well as a combination of both, e.g. a BiCMOS Phase modulator area combined with a CMOS baseband area. Generally, in the some embodiments, transistor speed is a concern, and BiCMOS provides faster speed. Additionally, BiCMOS provides less current drain than an all CMOS configuration.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. For example, various filtering components may be added as desired for filtering or processing signals propagating through the system. Various components may be combined or separated, or additional components may be added (such as isolating or gain controlling amplifiers). Accordingly, the foregoing description is by way of example only, and not limiting. The invention is limited only as defined in the following claims and equivalents thereto.

What is claimed is:

1. A method for the processing of an electromagnetic input signal, wherein said signal is passed through an input to be modified across a plurality of modifying segments to generate an output signal, wherein said plurality of segments have a plurality of states controlled by a control signal that is generated from a characteristic of the input signal, said method comprising the steps of:

determining a reference impedance for said input for one or more states of said plurality of segments; and adaptively adjusting impedance of said input toward said reference impedance;

wherein said input signal is a carrier wave modulated by a phase portion of an information signal, and said control signal is comprised from the magnitude portion of said input signal.

2. A method as in claim 1, wherein said adaptive adjustment of said impedance is accomplished by adjusting the phase of said input signal and the resistance of said input based upon said reference.

3. A method as in claim 1, wherein said adaptive adjustment of said impedance of said input is based upon a shift in impedance of said input away from said reference impedance due to a change in said state of said plurality of segments.

4. A method as in claim 1, wherein one or more of said segments is independently controlled as a power amplifier by said characteristic of said input signal to contribute power to an output signal.

5. A method as in claim 4, wherein said combining of power is accomplished using one or more selected from the group consisting of power transformers, quarter-wave transmission lines, discrete LC components, and a Pi-networks.

6. A method as in claim 1, wherein one or more of said segments is independently controlled as a current source by said characteristic of said input signal to contribute current to an output signal.

7. A method for the processing of an electromagnetic input signal, wherein said signal is passed through an input to be amplified across a plurality of amplifying segments to generate an output signal, wherein said plurality of segments have a plurality of states controlled by a control signal that is generated from a characteristic of the input signal, said method comprising the steps of:
    determining any shift in impedance of said input to said plurality of segments after a change in said state of said segments; and
    adaptively adjusting said impedance of said input based upon said shift;
    wherein said input signal is a carrier wave modulated by a phase portion of an information signal, and said control signal is comprised from the magnitude portion of said input signal.

8. A method as in claim 7, wherein said adaptive adjustment of said impedance of said input is accomplished by determining a reference state input impedance for said input, and adjusting the phase of said input signal and the resistance of said input after each change in state back toward said reference state input impedance.

9. An apparatus for processing an electromagnetic input signal, wherein said signal is passed through an input to be modified across a plurality of modifying segments to generate an output signal, wherein said plurality of segments have a plurality of states controlled by a control signal that is generated from a characteristic of the input signal, said apparatus comprising:
    a matching circuit to determine a reference impedance for said input for one or more states of said plurality of segments; and adaptively adjust impedance of said input toward said reference impedance; and
    a source of a carrier wave modulated by the phase portion of an information signal that is said electromagnetic input signal inputted into said plurality of segments, and a source for generating said control signal from a magnitude portion of said input signal.

10. The apparatus of claim 9, wherein said matching circuit comprises one or more selected from the group consisting of a digital signal processor, a microprocessor, a logic circuit, an integrated circuit, a phase shifter, a resistor, a variable inductor, and a variable capacitor.

11. The apparatus of claim 10, wherein said phase shifter comprises one or more selected from the group consisting of a digital stepped phase shifter, delay lines, waveguide elements, and microstrips.

12. The apparatus of claim 10, wherein said resistor is a digital resistor.

13. The apparatus of claim 9, wherein one or more of said segments is independently controlled as a power amplifier by said characteristic of said input signal to contribute power to an output signal.

14. The apparatus of claim 13, wherein said combining of power is accomplished using one or more selected from the group consisting of power transformers, quarter-wave transmission lines, discrete LC components, and a Pi-networks.

15. The apparatus of claim 9, wherein one or more of said segments is independently controlled as a current source by said characteristic of said input signal to contribute current to an output signal.

16. A method for the processing of an electromagnetic input signal, wherein said input signal is a carrier wave modulated by a phase portion of an information signal and wherein said input signal is passed through an input to be modified across a plurality of modifying segments to generate an output signal, the plurality of segments having a plurality of states controlled by a control signal comprising a magnitude portion of the input signal, said method comprising the steps of:
    determining a reference impedance for said input for one or more states of said plurality of segments; and
    adaptively adjusting impedance of said input toward said reference impedance.

17. An apparatus for processing an electromagnetic input signal, wherein said input signal is passed through an input to be modified across a plurality of modifying segments to generate an output signal, the plurality of segments having a plurality of states controlled by a control signal, said apparatus comprising:
    a matching circuit for determining a reference impedance for said input for one or more states of said plurality of segments, and for adaptively adjusting an impedance of said input toward said reference impedance;
    a source of a carrier wave modulated by a phase portion of an information signal that is the electromagnetic input signal inputted into the plurality of segments; and
    a source for generating the control signal from a magnitude portion of the input signal.

* * * * *